(12) United States Patent
Mirro, Jr. et al.

(10) Patent No.: US 7,456,414 B2
(45) Date of Patent: Nov. 25, 2008

(54) BEAM RE-REGISTRATION SYSTEM AND METHOD

(75) Inventors: Eugene Mirro, Jr., San Leandro, CA (US); Benyamin Buller, Cupertino, CA (US); Thomas D. Lamson, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 383 days.

(21) Appl. No.: 11/236,893

(22) Filed: Sep. 28, 2005

(65) Prior Publication Data

US 2007/0069155 A1    Mar. 29, 2007

(51) Int. Cl.
*G01N 23/00* (2006.01)
(52) U.S. Cl. .................................. 250/491.1
(58) Field of Classification Search .............. 250/491.1; 356/358, 363, 400; 378/34
See application file for complete search history.

(56) References Cited

U.S. PATENT DOCUMENTS

| | | | |
|---|---|---|---|
| 3,743,883 A | 7/1973 | Burns | 315/21 |
| 4,271,485 A | 6/1981 | Almasi et al. | 365/16 |
| 4,456,860 A | 6/1984 | Cann | 318/561 |
| 5,124,927 A | 6/1992 | Hopewell et al. | 364/468 |
| 5,144,225 A | 9/1992 | Talbot et al. | 324/73.1 |
| 5,214,489 A * | 5/1993 | Mizutani et al. | 356/490 |
| 5,313,068 A | 5/1994 | Meiri et al. | 250/492.22 |
| 5,315,123 A | 5/1994 | Itoh et al. | 250/492.22 |
| 5,345,085 A | 9/1994 | Prior | 250/491.1 |
| 5,363,196 A * | 11/1994 | Cameron | 356/500 |
| 5,521,390 A | 5/1996 | Sato et al. | 250/492.11 |
| 5,644,512 A | 7/1997 | Chernoff et al. | 364/571.02 |
| 5,825,670 A | 10/1998 | Chernoff et al. | 364/571.02 |
| 6,437,347 B1 | 8/2002 | Hartley et al. | 250/491.1 |
| 6,573,516 B2 | 6/2003 | Kawakami | 250/492.21 |
| 6,624,433 B2 * | 9/2003 | Okumura et al. | 250/548 |
| 6,753,115 B2 | 6/2004 | Zhang et al. | 430/5 |
| 6,912,435 B2 | 6/2005 | Pellegrini et al. | 700/121 |

\* cited by examiner

*Primary Examiner*—Kiet T Nguyen
(74) *Attorney, Agent, or Firm*—Shirley L. Church

(57) ABSTRACT

A beam re-registration system and method for error correction of a particle or other beam are disclosed. The beam re-registration system and method may include a particle or other beam, a stage movable in relation to the particle beam, at least two servos for controlling movement of the stage, a fixed target or grid located on the stage, and a re-registration controller adapted to control the servos. The re-registration controller may attenuate high frequency signals and amplify low frequency signals, and may be a type 2 controller which accurately corrects a ramp disturbance.

31 Claims, 5 Drawing Sheets

BEAM RE-REGISTRATION SYSTEM AND METHOD

BACKGROUND OF THE INVENTION

1. Field of the Invention

The present invention relates in general to a system and method of re-registration of a beam such as a particle beam. It more particularly relates to the re-registration of a particle beam lithography device and to the method of registration.

2. Background Art

There is no admission that the background art disclosed in this section legally constitutes prior art.

A typical lithographic pattern generator tool uses a scanning electron beam and X, Y stage motors to expose a radiation-sensitive resist on a glass plate or mask in order to print a pattern for one layer of a circuit. The finished mask is aligned to a wafer coated with light-sensitive photoresist, to complete the writing of the pattern onto the wafer.

During the making of the mask, the electron beam in the pattern generating tool may slowly drift away from its original position. This drift may be caused by temperature or drive voltage changes and is in the magnitude of nanometers. This drift would result in unacceptable placement errors on the wafer. To correct for this drift, the electron beam position is measured periodically using a fixed target. This drift is calculated and the correction is applied to subsequent patterns.

A problem with this approach is that the measurement process is noisy. This noise can cause the creation of erroneous electron beam position corrections. It is known that the drift is much slower than these noisy measurements suggest. A system and method is needed to apply the valid low frequency drift corrections while rejecting the high frequency measurement noise. Also, it would be desirable to make the drift corrections on the fly during the lithographic process.

BRIEF DESCRIPTION OF THE DRAWINGS

The features of this invention and the manner of attaining them will become apparent, and the invention itself will be best understood by reference to the following description of certain embodiments of the invention taken in conjunction with the accompanying drawings, wherein:

FIG. 2A is a fragmentary sectional view of the grid and beam detector of FIG. 2 taken substantially on line 2A-2A thereof;

DESCRIPTION OF CERTAIN EMBODIMENTS OF THE INVENTION

Figure 1:
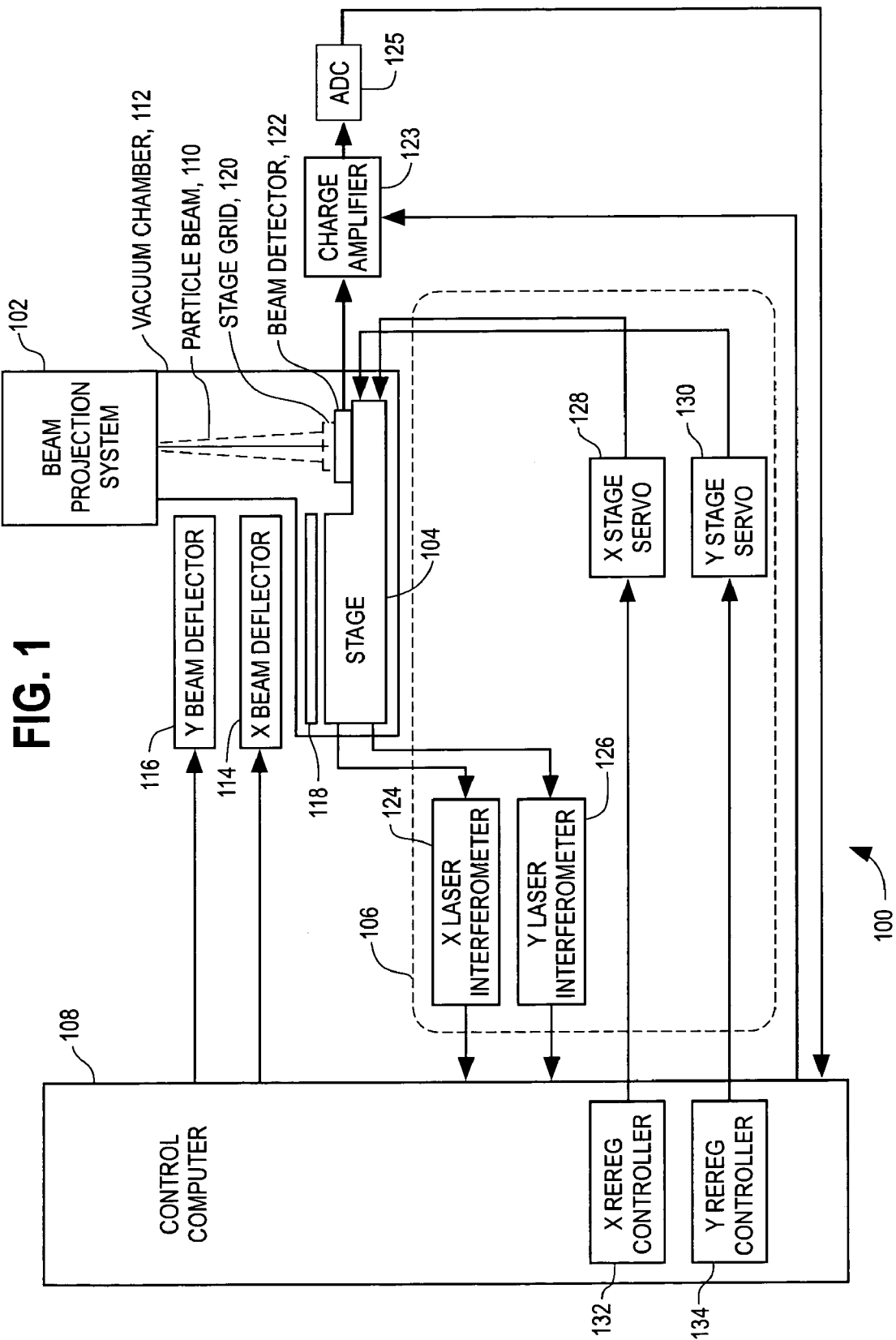
FIG. 1 is a block diagram of a beam re-registration system in accordance with an embodiment of the present invention.

It will be readily understood that the components of the embodiments as generally described and illustrated in the drawings herein, could be arranged and designed in a wide variety of different configurations. Thus, the following more detailed description of the embodiments of the system, components and method of the present invention, as represented in the drawings, is not intended to limit the scope of the invention, as claimed, but is merely representative of the embodiments of the invention.

A method and system are disclosed for computing corrections for periodically measured beam position errors for a particle beam or other such beams. According to an embodiment of the invention, the disclosed particle beam lithography system may include a particle or other beam, a stage movable in relation to the beam and having at least two servos for controlling movement of the stage, a fixed target or grid located on the stage, and a reregistration controller adapted to control the servos. The reregistration controller may attenuate high frequency signals and amplify low frequency signals.

In accordance with another disclosed embodiment of the invention, there is provided a method of re-registering a beam such as a particle or other beam. The method may include measuring a position of the particle beam using a fixed target on a movable stage, calculating a correction value by inputting the measured position into a double integrator type 2 servo controller, and commanding movement of the stage corresponding to the correction value.

According to another aspect of a disclosed embodiment of the invention, there is provided a method of re-registering a lithography device having a particle beam and a movable stage. The method may include measuring a position of the particle beam using a fixed target on the stage, inputting the measured position into a type 2 servo controller, and commanding a compensated movement of the stage with an output of the servo controller.

Referring to FIG. 1, an embodiment of a particle beam lithography system of the present invention is shown. Types of particle beams may include but are not limited to electron beams, proton beams, ion beams and others. The particle beam lithography system 100 may include a beam projection system 102, a stage 104, and a control computer 108.

The beam projection system 102 may include a particle beam 110, a vacuum chamber 112, an X beam deflector 114, and a Y beam deflector 116. The stage 104 on which a substrate 118 may be located may include a stage positioning subsystem 106 and a stage grid 120 having a beam detector 122. The stage positioning subsystem 106 may include an X laser interferometer 124 and a Y laser interferometer 126 to accurately measure the position of the stage 104, and an X stage servo 128 and a Y stage servo 130 to move the stage 104 in relation to the beam projection system 102. The output of beam detector 122 may be amplified by charge amplifier 123 and converted to a digital signal by analog-to-digital converter (ADC) 125 prior to being inputted to control computer 108.

The control computer 108 may include an X reregistration servo controller 132 and a Y reregistration servo controller 134, which may provide inputs to the X stage servo and the Y stage servo, respectively. The X reregistration servo controller 132 and Y reregistration servo controller 134 may each be type 2 controllers that are known to be able to accurately correct a ramp disturbance as described "Automatic Control Systems," Seventh Ed., Kuo, Benjamin C., ISBN 0-13-

304759-8. 1995 Prentice-Hall, Inc. Chapter 7 "Time Domain Analysis of Control Systems."

The X stage servo 128 and Y stage servo 130 may include an X stage servo controller and a Y stage servo controller (not shown), respectively. The stage servo controllers may receive and combine a stage command signal and a signal from one of the reregistration servo controllers. The combination of these signals may control the position of the stage.

Figure 2:
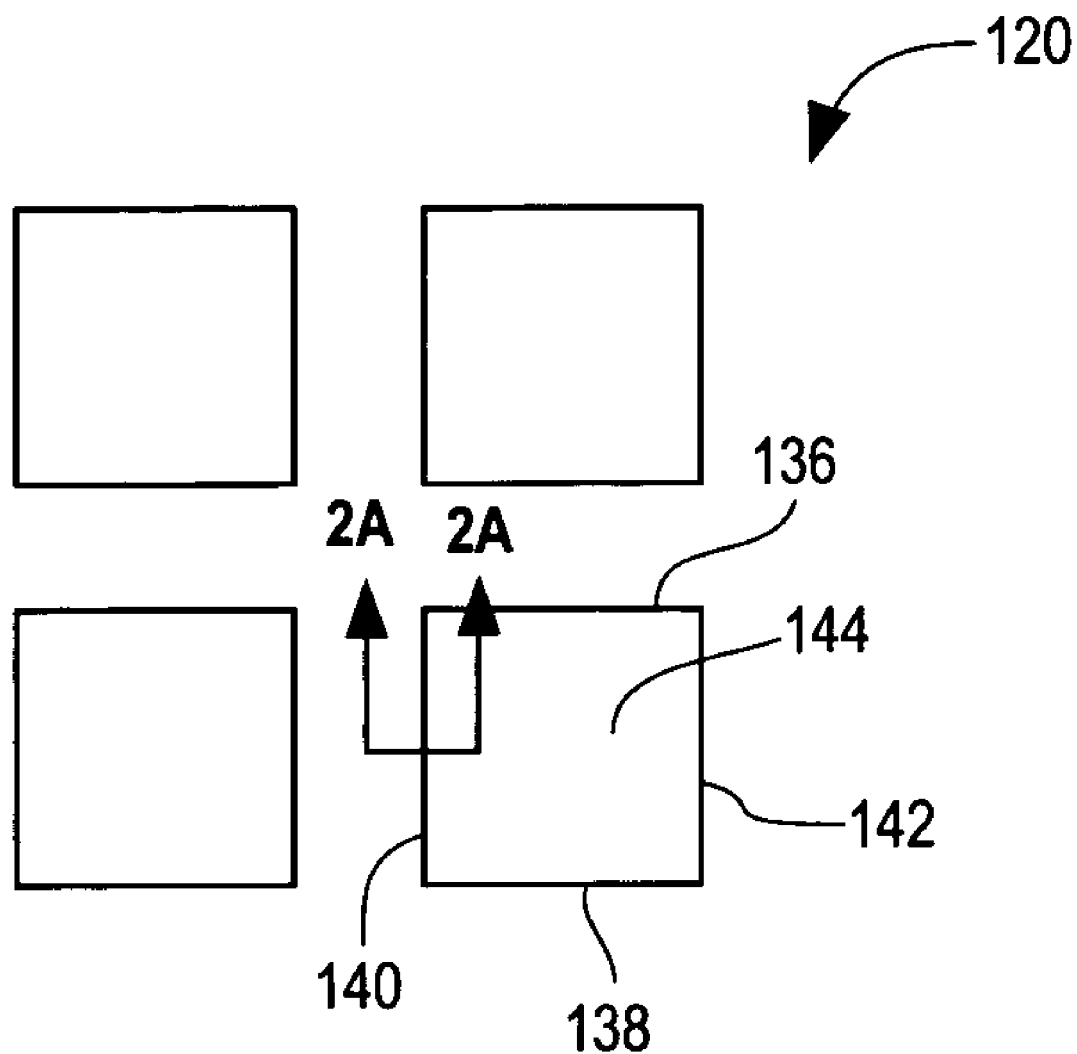
FIG. 2 is a fragmentary top plan diagrammatic view of a grid on a stage of the system of FIG. 1.

The stage grid 120 located on the stage 104 is shown in more detail in FIGS. 2 and 2A. The stage grid 120 may include a group of X edges including a pair of X edges 136, 138; a group of Y edges including a pair of Y edges 140, 142; and the beam detector 122. The edges may be manufactured to a very high accuracy, and may be positioned such that the X edge 136 may be parallel to the X edge 138, the Y edge 140 may be parallel to the Y edge 142, and the X edges 136, 138 may be perpendicular to the Y edges 140, 142. A grid center opening 144 may be bordered by the four edges 136, 138, 140, 142. The beam detector 122 may be located below the grid center opening 144. For an electron beam lithography system the beam detector may be a photodiode.

In operation, the beam position may be measured by moving the stage so that the entire particle beam is within the grid center of the stage grid, and therefore the entire beam strikes the beam detector. The intensity of the beam may be measured and stored using the beam detector. The beam may then be moved toward one of the Y edges by moving the stage while measuring the beam's intensity with the beam detector. When the beam is centered over the Y edge, the measured intensity may be one half of the stored intensity. The Y position of the stage may be measured and stored using the Y laser interferometer. The stage may then be moved such that the entire beam is within the center grid of the stage grid. The beam may then be moved toward one of the X edges by moving the stage while measuring the beam's intensity with the beam detector. When the beam is centered over the X edge, the measured intensity may be one half of the stored intensity. The X position of the stage may then be measured and stored using the X laser interferometer. Other methods of measuring the beam position may be used, such as moving the beam using the beam deflectors.

Figure 3:
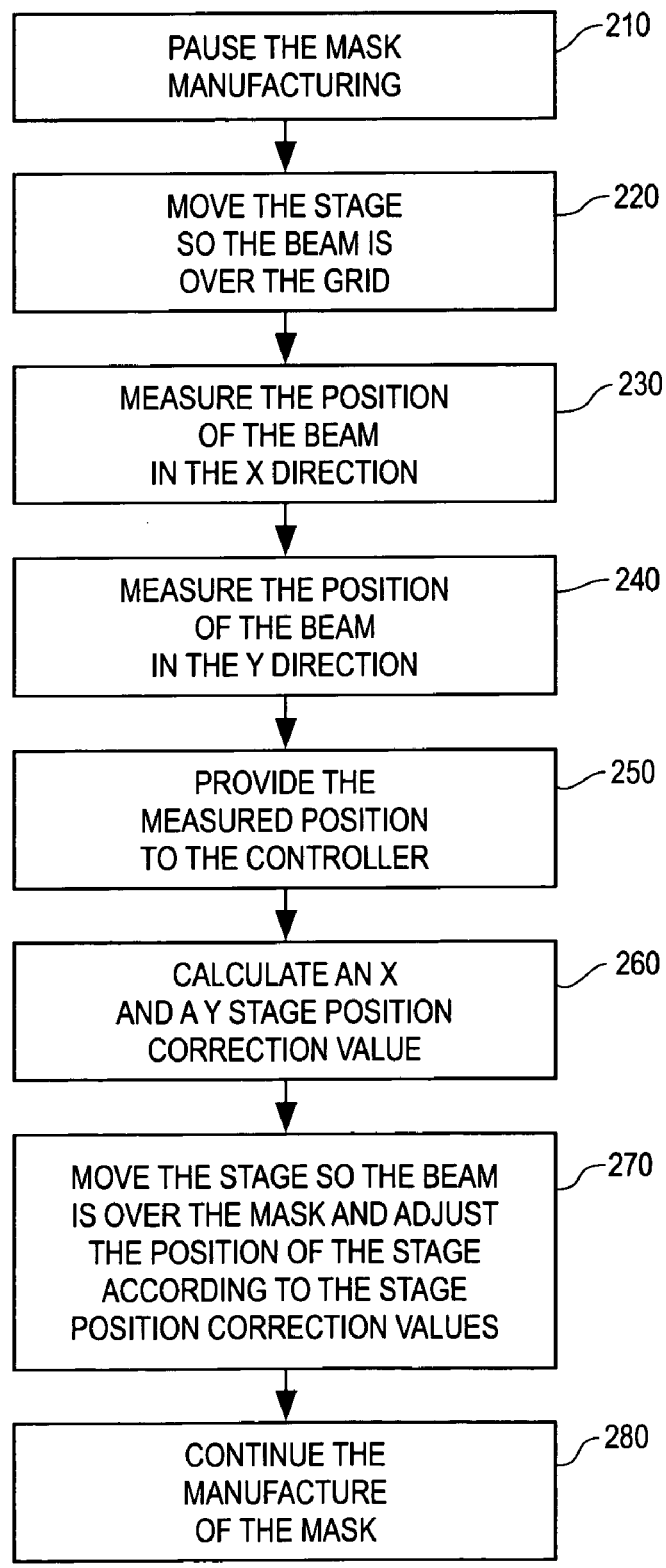
FIG. 3 is a flow chart of a process of correcting for drift of a beam of the system of FIG. 1 in accordance with an embodiment of the present invention.

During the manufacturing of a mask, for example, beam position measurements are periodically necessary to allow for compensation of the beam drift. The beam drift occurs at a low frequency, typically at the micro-hertz level and general below 30 micro-hertz. Noise is introduced during the measurement process and occurs at a higher frequency. Because the stage grid is connected with the stage and hence the mask or substrate, any beam drift detected at the stage grid substantially corresponds to the beam drift at the substrate. A method for compensating for the beam drift and rejecting the noise introduced during the measurement process according to an embodiment of the present invention is shown in FIG. 3.

The initial step of the method 200 may be to pause the manufacturing of the mask as shown in step 210. In step 220 the stage including the mask and stage grid may be moved to place the beam over the stage grid. The placement of the beam over the stage grid may vary depending on the method of measurement. Next a measurement of the position of the beam in the X direction may be accomplished as shown in step 230. In step 240 a measurement of the position of the beam in the Y direction may be accomplished. The order of steps 230 and 240 may be reversed.

In step 250 the measured X and Y positions of the beam may be provided to an X reregistration controller and a Y reregistration controller, respectively. The X reregistration controller and Y reregistration controller may be type 2 controllers that accurately correct ramp disturbances. An X stage position correction value and a Y stage correction value may be calculated in the X reregistration controller and the Y reregistration controller, respectively, as shown in step 260. In step 270 the stage may be moved back to place the beam over the mask using the stage position correction values to modify the final position of the stage. In this manner the stage position may be adjusted to compensate for the drift of the beam. In step 280 the manufacturing of the mask may continue.

Due to the low frequency of the disturbance or drift of the beam desired to be compensated for, the rate at which the above method may be called during the manufacturing of the mask may be once per five minutes, ten minutes, or even greater. This sample rate of the measured positions of the beam may be dependent on the frequency of the disturbance or drift.

This method of compensating for the beam drift and rejecting the noise introduced during the measurement process may not only be used in the manufacturing of masks, but also in the manufacturing of substrates.

Figure 4:
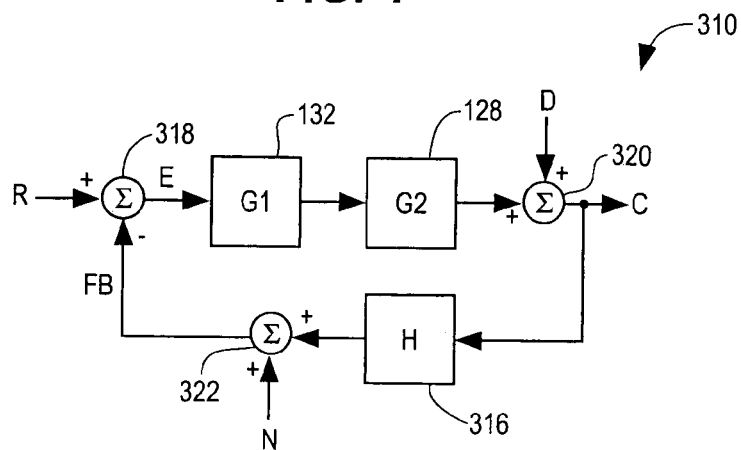
FIG. 4 is a diagram of a servo architecture of the beam system of FIG. 1.

Referring now to FIG. 4, an embodiment of the servo architecture of the system 100 is shown. The servo loop architecture 310 may include the X reregistration servo controller 132, the X stage servo 128, a feedback gain 316, and three summers 318, 320, and 322. A similar arrangement (not shown) is employed for the Y reregistration servo controller 134 and Y stage servo 130. A servo command R, the desired electron beam position with respect to the stage, may be inputted into the difference block 318. A controlled variable C, the electron beam position with respect to the stage, may be outputted from the summer 320. An undesirable disturbance D, the low frequency drift of the electron beam, may be introduced at the summer 320. High frequency noise N from the measurement may be introduced at the summer 322. A feedback FB, the actual electron beam position with respect to the stage plus the noise N, may be outputted from the summer 322 and inputted to difference block 318. An error E, the difference between servo command R and feedback FB, may be outputted from difference block 318 and inputted into reregistration servo controller 132.

The re-registration servo controller 132 may stabilize the servo loop architecture 310 and may have a gain G1 that may be frequency dependent such that the low frequency error is amplified and the high frequency error is attenuated. The stage servo 128 may be controlled in servo loop and architecture 310, may be very fast in comparison to the servo loop 310, and may have a gain G2. The feedback gain 316 may have a gain H that is generally independent of frequency.

Servo Loop Transfer Functions

To calculate the command response C/R, set all other inputs (D, N) to zero and write the equation for C by inspection of the FIG. 4 as follows:

$$C=E*(G1*G2)=(R-FB)*(G1*G2)=(R-C*H)*G1*G2.$$

Collect terms with C: $C+C*H*G1*G2=R*G1*G2$.

Solve for $C$: $C = \dfrac{R*G1*G2}{1+G1*G2*H}$

Now find $C/R$: $\dfrac{C}{R} = \dfrac{G1*G2}{1+G1*G2*H}$.

This last equation describes the relationship between the controlled variable C and the servo command R. In the presently described application, R=0, so it does not appear explicitly in FIG. 5.

In a similar manner, the disturbance response C/D may be calculated as follows:
By inspection: C=E*G1*G2+D*G2=−C*H*G1*G2+D
Collect terms with C: C+C*H*G1*G2=D $$\text{Solve for } C: C = \frac{D}{1 + G1 * G2 * H}$$

$$\text{Now find } C/D: \frac{C}{D} = \frac{1}{1 + G1 * G2 * H} = \frac{C}{R} * \frac{1}{G1 * G2}$$

The last equations describe the relationship between the controlled variable C and the disturbance or drift D. Since C/R is the gain to the command, it may be used as a basis for comparison. G1 may be the reregistration servo controller, so it may generally have high DC gain and low high-frequency gain. G2 may be the stage servo gain, which may be one at low frequencies. Since the drift D may be a low frequency phenomenon, the gain G1 may be large at low frequencies to keep C/D small. Therefore, the disturbance gain C/D may be very small at DC and low frequencies, and high at high frequencies, compared to C/R.

Likewise, the measurement noise response C/N may be calculated as follows:
By inspection: C=E·G1*G2=−(C*H+N)*G1*G2
Collect terms with C: C+C*H*G1*G2=−N*G1*G2

$$\text{Solve for } C: C = \frac{-N * G1 * G2}{1 + G1 * G2 * H}$$

$$\text{Now find } C/N: \frac{C}{N} = \frac{-G1 * G2}{1 + G1 * G2 * H} = -\frac{C}{R}$$

The last equations describe the relationship between the controlled variable C and the noise N. Therefore, the measurement noise gain C/N may have the same bandwidth as the command gain C/R. With the feedback gain H equal to 1, the noise bandwidth may be approximately equal to the unity gain frequency of G1*G2. With the gain G2 of the stage servo equal to 1, the noise bandwidth may be approximately equal to the unity gain frequency of G1 of the reregistration servo controller. The gain G1 may be large at low frequencies to amplify the drift D and may be small at high frequencies to attenuate the measurement noise N.

With low frequency disturbances and high frequency measurement noise, the controller may be tuned so that the bandwidth of C/R may be below the noise frequencies, but above the disturbance frequencies. Then both the disturbances and the measurement noise may be attenuated by the servo.

Figure 5:
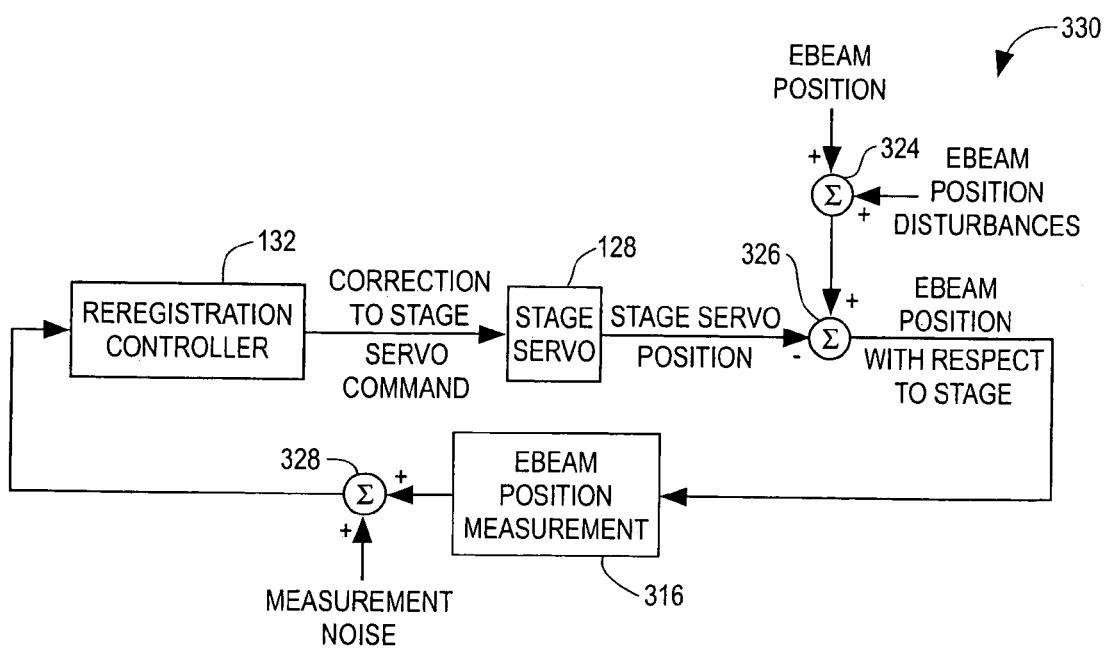
FIG. 5 is a flow diagram of a servo loop in accordance with the servo architecture of FIG. 4.

Referring now to FIG. 5, a flow diagram of the system 100 based on the servo architecture of FIG. 4, is shown. The flow diagram is based on the servo loop architecture 310 of FIG. 4 with the servo command R being set at the constant zero. C is defined as the ebeam position with respect to the stage. The servo loop 330 is based on and may function in a similar manner as described above for the servo loop architecture 310.

The beam position and the beam position disturbance or drift may be combined at summer 324. At summer 326 the stage servo position from stage servo 128 may be subtracted from the output of summer 324 resulting in the beam position with respect to the stage. The measurement of beam position with respect to the stage at 316 introduces measurement noise at summer 328. The measurement of the beam position with the measurement noise may be inputted to the reregistration servo controller 132. The reregistration servo controller 132 may be a type 2 controller designed to reject the measurement noise and amplify the beam position disturbance or drift. As discussed previously, the beam position disturbance or drift may be at a low frequency and the measurement noise at a much higher frequency. The reregistration servo controller 132 calculates a correction for the stage servo command and provides this correction to the X stage servo 128. Therefore, any drift of the beam in the X direction may be compensated for by an adjustment of the position of the stage. A similar correction may be made for the Y stage servo 130.

The particle beam lithography system 100 may include a reregistration servo loop as described above for each stage servo. Typically, the stage may have a pair of servos for controlling perpendicular directions of the stage.

Servo Controller Disturbances Reduction

Referring back to FIG. 4, C represents the output parameter to be controlled precisely. If a disturbance D is present, the disturbance should not appear in C. If the output of G2 is −D, then the output of the summer 320 may be zero, and the disturbance may not appear at C. If D is a ramp, D(t)=kt, then the desired output of G2 may be −kt. Since G2=1, the desired output of G1 may be −kt.

In the case of the re-registration servo, R=0. So the ideal value of FB is zero. In this case, error E=−FB and may be ideally zero. This may define the ideal transfer function of G1, that is a function which can generate an output ramp −kt with an input of zero. A double integrator may be capable of this type of output. Considering a single integrator, if the input is a constant, the output is a linear ramp. If a single integrator is used as the controller G1, it can make the ramp −kt at its output, but its input E must be a nonzero constant to do so. Since E is error, the servo will have a fixed tracking error when a ramp disturbance is present.

Figure 7:
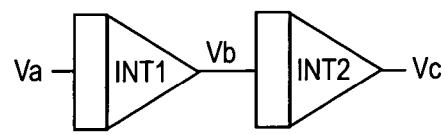
FIG. 7 is a diagram of two cascaded integrators.
Figure 8:
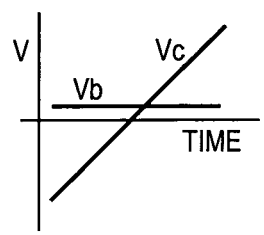
FIG. 8 is a timing diagram of the outputs of the integrators of FIG. 7.

Referring to FIGS. 7 and 8, two integrators in cascade and a timing diagram for the outputs of the integrators are shown. The second integrator output Vc may be the output of G1. The second integrator may output a ramp −kt if it has a constant input Vb. But Vb may be the output of the first integrator. An integrator has a constant output only if its input is zero. Therefore we have a controller which can output a ramp −kt with an input of zero. So the disturbance error at the output C may be zero with a ramp disturbance. However, when the ramp first appears, it may take some time for Vb to reach the proper constant value. Va may not be zero during this time. So the controller may be thought of as having a transient response, when the tracking error is not zero, and a steady-state response, when the tracking error is zero.

The type 2 controller or system implies the use of two integrators in a servo loop. Both integrators may be preferable located in the reregistration servo controller, but one integrator or the other may be in other parts of the servo loop, such as the plant or the feedback loop.

Figure 6:
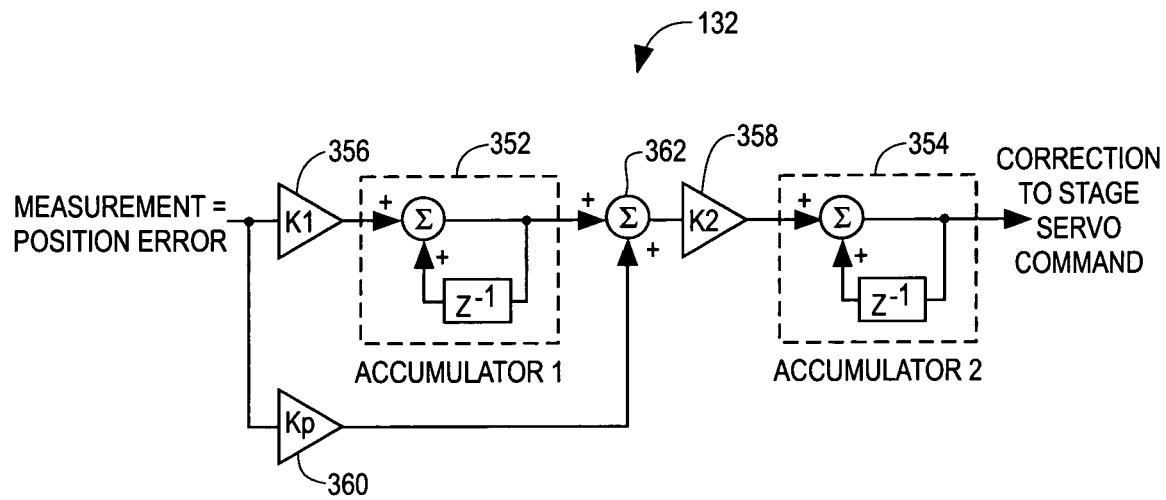
FIG. 6 is a diagram of an embodiment of a servo controller for the servo loop of FIG. 5.

Referring now to FIG. 6, an embodiment of a reregistration servo controller such as the X reregistration servo controller 132 is shown. The reregistration servo controller 132 may be a type 2 controller with two integrators in series since this type of controller may be designed to have high gain at low frequencies and low gain at high frequencies. The first integrator may receive the measured beam position with the measurement noise and may output a constant value to the second integrator. The second integrator then may output a ramp that follows the beam position disturbance or drift. Once the output ramp of the second integrator matches the drift, the input at the first integrator may just include the measurement noise which should average to zero.

The re-registration servo controller 132 is shown as implemented in software using z transform methodology. However, it is to be understood that the controller may also be implemented in hardware or in a combination of hardware and software. The reregistration servo controller 132 may include the first integrator as a first accumulator 352, the second integrator may be a second accumulator 354, amplifiers 356, 358, and 360, and a summer 362. Each accumulator includes a summer and a feedback loop that is delayed by one sample period. The accumulators in software may be mathematically equivalent to an integrator. The amplifiers 356, 358, and 360 may have associated gains of K1, K2, and Kp, respectively. The values of K1, K2, and Kp may be selected to achieve the desired bandwidth of the servo loop to pass the low frequency drift and reject the higher frequency measurement noise.

The amplifier 360 with a gain of Kp provides stability for the reregistration servo controller 132 by tuning the controller to compensate for the phase lag introduced by the accumulators when the servo loop is closed. In this manner, the reregistration servo controller 132 may not ring or oscillate.

Each accumulator may be assigned an initial condition prior to the first sample period. The initial condition assigned to the second accumulator may be the initial position correction value. The initial condition assigned to the first accumulator may determine the initial slope of the second accumulator output. Use of initial conditions may drastically improve drift correction during the first few sample periods.

The software implementation of the algorithm of the reregistration servo controller may be as follows:

1. Measure the beam position error and use the result as the baseline for corrections.
2. Initialize coefficients K1, K2, and Kp with values that pass the desired frequencies and reject the undesired frequencies for the desired measurement sample period.
3. Initialize software variables, initial conditions, for the first accumulator and the second accumulator to zero.
4. Begin printing features on the mask for a period of time equal to the measurement sample period.
5. Measure the beam position error and compute the correction as follows:

Accumulator1($n$)=Accumulator1($n$-1)+$K1$*Error($n$)

Sum($n$)=Accumulator1($n$)+$Kp$*Error($n$)

Accumulator2($n$)=Accumulator2($n$-1)+$K2$*Sum($n$)

Correction($n$)=Accumulator2($n$)

6. Add the correction to the locations for printing the next set of features on the mask.
7. If there are any remaining features to be printed then continue printing for a period of time equal to the measurement sample period.
8. Go back to step 5.

The values of the coefficients, K1, K2, and Kp, may be calculated in a number of methods. One method may involve taking a number of measurements and inputting these measurements into a Fast Fourier Transform (FFT) to obtain the frequency of the measurement noise. The coefficients may then be calculated to reject the high frequency measurement noise and pass the low frequency disturbance or drift. An empirical method may also be employed by changing the coefficients until the desired low frequency disturbance is passed and the high frequency measurement noise is rejected. Other methods may be employed and may be as equally acceptable.

Each particle beam lithography system may typically include at least two reregistration servo controllers controlling the stage servos. The software implementation shown above may be identical for each of these reregistration servo controllers.

While particular embodiments of the present invention have been disclosed, it is to be understood that various different embodiments are possible and are contemplated within the true spirit and scope of the appended claims. There is no intention, therefore, of limitations to the exact abstract or disclosure herein presented.

What is claimed is:

1. A method of re-registering a particle beam and a movable stage, comprising:

measuring a position of the particle beam using a fixed target on the stage;

calculating a correction value by inputting the measured position into a double integrator; and commanding movement of the stage corresponding to the correction value.

2. The method of claim 1, wherein measuring the position of the particle beam includes moving the stage to approximately center the particle beam over the fixed target.

3. The method of claim 1, wherein measuring the position of the particle beam includes deflecting the particle beam to approximately center the particle beam over the fixed target.

4. A method in accordance with claim 3, wherein said particle beam is an electron beam.

5. The method of claim 1, wherein the fixed target is a grid having a beam detector.

6. The method of claim 1, wherein the double integrator is implemented in software by a pair of accumulators.

7. The method of claim 1, wherein measuring the position of the particle beam includes measuring a first position of the particle beam in a first direction and measuring a second position of the particle beam in a second direction, wherein the first direction is perpendicular to the second direction.

8. The method of claim 7, wherein calculating the correction value includes calculating a first correction value for the first direction by inputting the first position into a first double integrator and calculating a second correction value for the second direction by inputting the second position into a second double integrator.

9. The method of claim 8, wherein commanding movement of the stage includes commanding a first movement of the stage in the first direction using the first correction value and commanding a second movement of the stage in the second direction using a second correction value.

10. The method of claim 1, further including providing at least one initial condition to the double integrator.

11. A method in accordance with claim 1, wherein said particle beam is an electron beam.

12. A method of re-registering a particle beam and a movable stage, comprising:

measuring a position of the particle beam using a fixed target on the stage;

inputting the measured position into a type 2 servo controller; and commanding a compensated movement of the stage with an output of the servo controller.

13. The method of claim 12, wherein the servo controller attenuates high frequency signals and amplifies low frequency signals.

14. The method of claim 12, wherein the servo controller includes a double integrator.

15. The method of claim 14, wherein the double integrator is implemented in software by a pair of accumulators.

16. The method of claim 12, wherein measuring the position of the particle beam includes moving the stage to approximately center the particle beam over the fixed target.

17. The method of claim 12, wherein measuring the position of the particle beam includes deflecting the particle beam to approximately center the particle beam over the fixed target.

18. A method in accordance with claim 17, wherein said particle beam is an electron beam.

19. The method of claim 12, wherein the fixed target is a grid having a beam detector.

20. The method of claim 19, wherein the beam detector is a photodiode.

21. The method of claim 12, wherein measuring the position of the particle beam includes measuring a first position of the particle beam in a first direction and measuring a second position of the particle beam in a second direction, wherein the first direction is perpendicular to the second direction.

22. The method of claim 21, wherein calculating a correction value includes calculating a first correction value for the first direction by inputting the first position into a first double integrator and calculating a second correction value for the second direction by inputting the second position into a second double integrator.

23. The method of claim 22, wherein commanding a compensated movement of the stage includes commanding a first compensated movement of the stage in the first direction using the first correction value and commanding a second compensated movement of the stage in the second direction using the second correction value.

24. A method in accordance with claim 12, wherein said particle beam is an electron beam.

25. A lithography device, comprising:
a beam projector for producing a beam;
a stage movable in relation to the beam and having at least two servos for controlling movement of the stage;
a fixed target located on the stage; and
a re-registration controller adapted to control the servos, wherein the re-registration controller attenuates high frequency signals and amplifies low frequency signals.

26. The lithography device of claim 25, wherein the re-registration controller includes a re-registration servo controller for each servo.

27. The lithography device of claim 26, wherein each re-registration servo controller is a type 2 controller.

28. The lithography device of claim 27, wherein at least one initial condition is provided to at least one of the re-registration servo controllers.

29. The lithography device of claim 27, wherein each re-registration servo controller includes a double integrator.

30. The lithography device of claim 25, wherein the high frequency signals have a frequency above 30 micro-hertz.

31. The lithography device of claim 25, wherein the low frequency signals have a frequency below 30 micro-hertz.

* * * * *